United States Patent
Kim et al.

(10) Patent No.: US 10,971,335 B2
(45) Date of Patent: Apr. 6, 2021

(54) RADIO FREQUENCY (RF) POWER MONITORING DEVICE AND PLASMA ENHANCED (PE) SYSTEM INCLUDING THE SAME

(71) Applicant: SAMSUNG ELECTRONICS CO., LTD., Suwon-si (KR)

(72) Inventors: Hyungjoon Kim, Suwon-si (KR); Myoungwoon Kim, Suwon-si (KR); Hee jong Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/661,579

(22) Filed: Oct. 23, 2019

(65) Prior Publication Data
US 2020/0343075 A1  Oct. 29, 2020

(30) Foreign Application Priority Data

Apr. 29, 2019 (KR) .................. 10-2019-0049827

(51) Int. Cl.
*H01J 37/32* (2006.01)
*H01P 5/02* (2006.01)

(52) U.S. Cl.
CPC ...... *H01J 37/32183* (2013.01); *H01J 37/321* (2013.01); *H01J 37/32091* (2013.01); *H01J 37/32926* (2013.01); *H01J 37/32935* (2013.01); *H01P 5/026* (2013.01)

(58) Field of Classification Search
None
See application file for complete search history.

(56) References Cited

U.S. PATENT DOCUMENTS

| | | | | |
|---|---|---|---|---|
| 6,020,795 A | * | 2/2000 | Kim | H03F 1/56 333/33 |
| 7,157,857 B2 | * | 1/2007 | Brouk | H01J 37/32183 315/111.21 |
| 7,383,033 B2 | * | 6/2008 | Holger | H03L 7/0995 455/264 |
| 7,538,562 B2 | | 5/2009 | Garvin et al. | |
| 8,040,068 B2 | * | 10/2011 | Coumou | H01J 37/32082 315/111.21 |
| 8,149,748 B2 | | 4/2012 | Bata et al. | |
| 8,154,206 B2 | | 4/2012 | Choi et al. | |
| 8,457,064 B2 | * | 6/2013 | Gupta | H04W 36/30 370/331 |

(Continued)

FOREIGN PATENT DOCUMENTS

| | | |
|---|---|---|
| JP | 5599607 B2 | 10/2014 |
| KR | 10-2003-0086673 A | 11/2003 |

(Continued)

*Primary Examiner* — Amy Cohen Johnson
*Assistant Examiner* — Srinivas Sathiraju
(74) *Attorney, Agent, or Firm* — Lee IP Law, PC (57) ABSTRACT

A radio frequency (RF) power monitoring device includes an RF sensor to monitor RF power transferred to a target load and an impedance of the target load and a transmission line to electrically connect the RF sensor to the target load and to transfer the RF power to the target load. A phase ($\varphi z$) of the impedance of the target load is adjusted to satisfy a range of $-30°+180°\cdot n < \varphi z < 30°+180°\cdot n$ (where n=−2, −1, 0, 1, or 2).

20 Claims, 9 Drawing Sheets

(56) References Cited

U.S. PATENT DOCUMENTS

| | | | |
|---|---|---|---|
| 8,674,606 B2* | 3/2014 | Carter | H01J 37/32935 |
| | | | 315/111.21 |
| 9,041,292 B2* | 5/2015 | Coumou | H01J 37/32082 |
| | | | 315/111.21 |
| 9,088,267 B2* | 7/2015 | Blackburn | H01J 37/32183 |
| 9,336,995 B2* | 5/2016 | Coumou | H01J 37/32082 |
| 9,337,000 B2* | 5/2016 | Marakhtanov | H01J 37/32183 |
| 9,652,567 B2* | 5/2017 | Valcore, Jr. | G06F 30/20 |
| 9,715,996 B2 | 7/2017 | Son | |
| 9,741,544 B2* | 8/2017 | Van Zyl | H01J 37/32183 |
| 9,754,767 B2* | 9/2017 | Kawasaki | H01J 37/32155 |
| 9,805,919 B1* | 10/2017 | Hanks | H01J 37/32155 |
| 9,831,071 B2* | 11/2017 | Howald | H01J 37/32926 |
| 9,837,252 B2* | 12/2017 | Howald | H01J 37/32926 |
| 9,840,776 B2* | 12/2017 | Kapoor | H01L 21/0262 |
| 9,842,725 B2* | 12/2017 | Valcore, Jr. | H01J 37/32183 |
| 9,865,432 B1* | 1/2018 | Bhutta | H01J 37/32183 |
| 9,954,508 B2* | 4/2018 | Leeser | H03H 7/38 |
| 10,128,090 B2* | 11/2018 | Valcore, Jr. | H03J 7/00 |
| 10,224,184 B2* | 3/2019 | Van Zyl | H01J 37/32146 |
| 10,229,816 B2* | 3/2019 | Coumou | H03F 1/0233 |
| 10,269,540 B1* | 4/2019 | Carter | H01J 37/32183 |
| 10,325,759 B2* | 6/2019 | Valcore, Jr. | H01J 37/32926 |
| 10,460,912 B2* | 10/2019 | Bhutta | H05K 7/20609 |
| 10,522,377 B2* | 12/2019 | Zhang | H01J 37/32935 |
| 10,553,465 B2* | 2/2020 | Augustyniak | H01L 21/67201 |
| 10,607,815 B2* | 3/2020 | Ghantasala | H01J 37/32183 |
| 2005/0134186 A1* | 6/2005 | Brouk | H01J 37/32183 |
| | | | 315/111.21 |
| 2009/0295509 A1 | 12/2009 | Master et al. | |
| 2015/0091440 A1* | 4/2015 | Marakhtanov | H01J 37/32183 |
| | | | 315/111.21 |
| 2015/0206716 A1* | 7/2015 | Kim | H01J 37/32183 |
| | | | 156/345.48 |
| 2017/0010251 A1 | 1/2017 | Scott | |
| 2017/0062186 A1* | 3/2017 | Coumou | H01J 37/32165 |
| 2018/0005857 A1* | 1/2018 | Zhang | H01J 37/32935 |
| 2018/0330921 A1* | 11/2018 | Radomski | H01J 37/321 |
| 2019/0108980 A1* | 4/2019 | van Zyl | H01J 37/32174 |
| 2020/0118856 A1* | 4/2020 | Augustyniak | H01J 37/32183 |

FOREIGN PATENT DOCUMENTS

| KR | 10-1012345 B1 | 1/2011 |
|---|---|---|
| KR | 10-2014-0122548 A | 10/2014 |
| KR | 10-1930440 B1 | 12/2018 |

* cited by examiner

RADIO FREQUENCY (RF) POWER MONITORING DEVICE AND PLASMA ENHANCED (PE) SYSTEM INCLUDING THE SAME

CROSS-REFERENCE TO RELATED APPLICATION

Korean Patent Application No. 10-2019-0049827, filed on Apr. 29, 2019, in the Korean Intellectual Property Office, and entitled: "Radio Frequency (RF) Power Monitoring Device and Plasma Enhanced (PE) System Including the Same," is incorporated by reference herein in its entirety.

BACKGROUND

1. Field

Example embodiments relate to a plasma generation device, and more particularly, to a device for monitoring radio frequency (RF) power transferred to a plasma chamber.

2. Description of the Related Art

In general, a variety of processes, e.g., deposition, etching, and cleaning, are required to manufacture semiconductor devices. These processes may be performed by, e.g., deposition, etching, or cleaning devices including process chambers. To improve selectivity and minimize damage to film quality, plasma techniques, e.g., capacitively coupled plasma (CCP), inductively coupled plasma (ICP), or combinations of CCP and ICP, have been used. The plasma techniques may include direct plasma techniques and remote plasma techniques. The direct plasma techniques may generate a plasma inside process chambers, and the remote plasma techniques may generate a plasma outside process chambers and supply the plasma to the process chambers.

SUMMARY

Embodiments are directed to a radio frequency (RF) power monitoring device including an RF sensor to monitor RF power transferred to a target load and an impedance of the target load and a transmission line to electrically connect the RF sensor to the target load and to transfer the RF power to the target load, wherein a phase ($\varphi z$) of the impedance of the target load is adjusted to satisfy a range of $-30°+180°*n<\varphi z<30°+180°*n$ (where n=-2, -1, 0, 1, or 2).

Embodiments are directed to a radio frequency (RF) power monitoring device including an RF power splitter to split RF power from an RF generator into a plurality of partial RF powers and to supply the plurality of partial RF powers to a plurality of plasma chambers, RF sensors that is arranged to an output stage of the RF power splitter, each RF sensor to monitor each partial RF power transferred to each plasma chamber and an impedance of each plasma chamber, and transmission lines to electrically connect between the RF sensors and the plurality of plasma chambers, each transmission line to transfer each corresponding partial RF power to each corresponding plasma chamber, wherein a phase of the impedance of each plasma chamber is adjusted by adjusting a physical size or a physical property of each transmission line.

Embodiments are directed to a plasma enhanced (PE) system including a radio frequency (RF) generator to generate RF power, a plasma chamber to receive the RF power, a matcher between the RF generator and the plasma chamber, the matcher to reduce a reflection of the RF power, an RF sensor that is arranged to an output stage of the matcher and to monitor the RF power transferred to the plasma chamber and an impedance of the plasma chamber, and a transmission line to electrically connect the RF sensor to the plasma chamber and to transfer the RF power to the plasma chamber, wherein a phase ($\varphi z$) of the impedance of the plasma chamber is adjusted to satisfy a range of $-30°+180°*n<\varphi z<30°+180°*n$ (where n=-2, -1, 0, 1, or 2), by adjusting a physical size or a physical property of the transmission line.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, embodiments will be described in detail with reference to the accompanying drawings. Like components will be denoted by like reference numerals throughout the specification, and repeated descriptions thereof will be omitted.

Figure 1A:
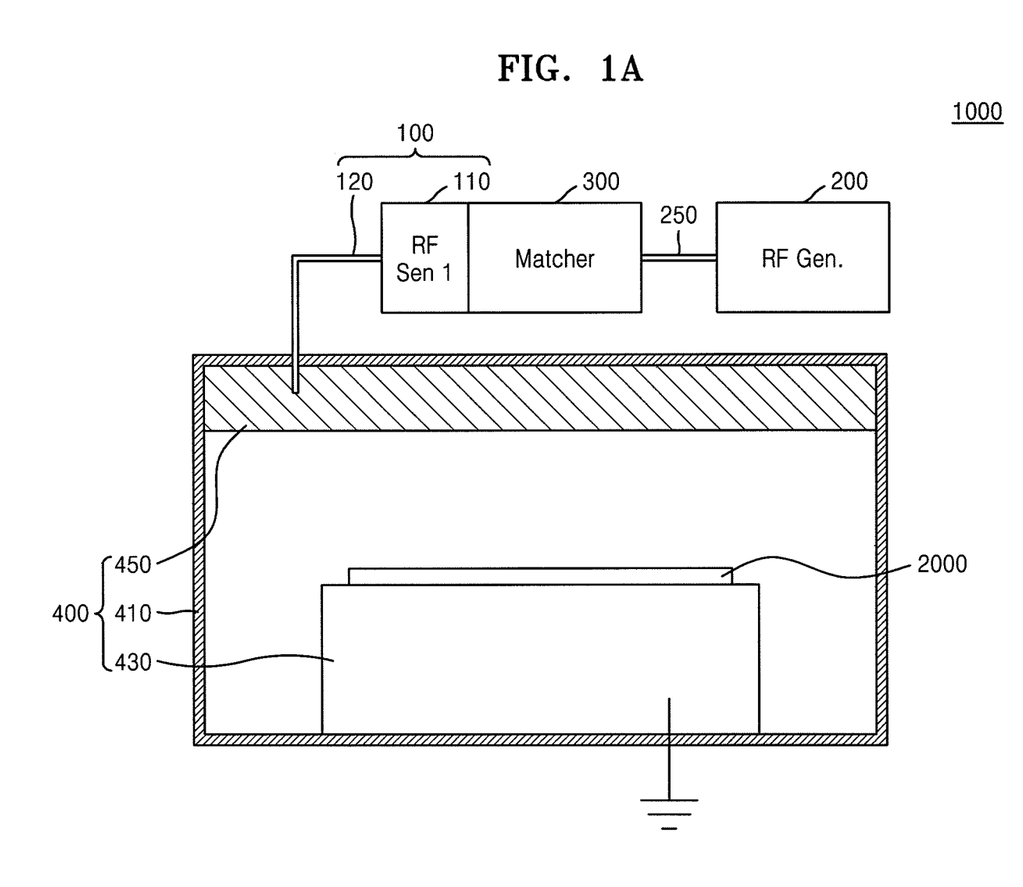
FIGS. 1A and 1B illustrate an embodiment of a plasma enhanced (PE) system.
Figure 1B:
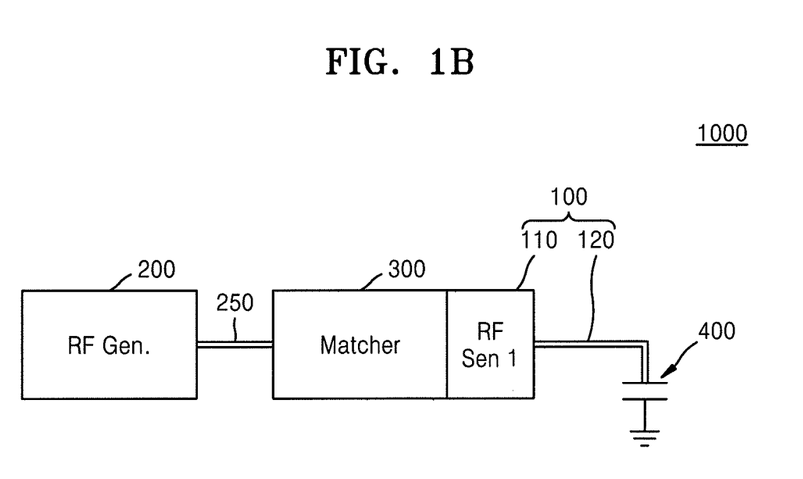

FIGS. 1A and 1B illustrate an example embodiment of a plasma enhanced (PE) system 1000. Referring to FIGS. 1A and 1B, the PE system 1000 may include a radio frequency (RF) power monitoring device 100, an RF generator 200, a matcher 300, and a plasma chamber 400.

The RF generator 200 may generate RF power that is supplied to the plasma chamber 400. The generated RF power by the RF generator 200 may be transferred to the plasma chamber 400 through the matcher 300 for minimizing a reflection of the RF power. The RF power monitoring device 100 may monitor the RF power that is transferred to the plasma chamber 400.

For example, the RF power monitoring device 100 may include a first RF sensor 110 and a first transmission line 120. The first RF sensor 110 may measure an amount of the RF power that is transferred to the plasma chamber 400 and/or impedance of the plasma chamber 400. The first RF sensor 110 may be arranged at an output stage of the matcher 300. For example, the first RF sensor 110 may be coupled to the output stage of the matcher 300. For example, the output stage of the matcher 300 may output the RF power from the RF generator 200 to the RF power monitoring device 100. For example, the output stage of the matcher 300 may output the RF power in a transferring direction of the RF power from the RF generator 200 to the plasma chamber 400. Further, an input stage of the matcher 300 may receive the RF power from the RF generator 200. The first transmission line 120 may connect the first RF sensor 110 of the RF power monitoring device 100 to the plasma chamber 400 and transfer the RF power to the plasma chamber 400.

The impedance of the plasma chamber 400 may have a phase that is adjusted by adjusting a characteristic of the first transmission line 120, e.g., a physical size, physical properties, or the like. For example, the phase of the impedance of the plasma chamber 400 may be moved near 0° by adjusting the characteristic of the first transmission line 120 such that the first RF sensor 110 may precisely measure the RF power that is delivered to the plasma chamber 400. Thus, measurement precision of the first RF sensor 110 on the delivered RF power may be improved. For example, the phase of the impedance of the plasma chamber 400 may be adjusted by an automatic adjustment device and/or a manual adjustment device. For example, the physical size or physical properties of the first transmission line 120 may be automatically adjusted electrically and mechanically by the automatic adjustment device. Further, the physical size or physical properties of the first transmission line 120 may be directly adjusted by, e.g., a manufacturer, a user, or the like.

An adjustment method of the phase of the impedance of the plasma chamber 400 may vary according to types of the first transmission line 120 that connects between the first RF sensor 110 and the plasma chamber 400. Regarding the adjustment method of the phase of the impedance, descriptions will be made in more detail with reference to FIGS. 2A and 2B.

Figure 2A:
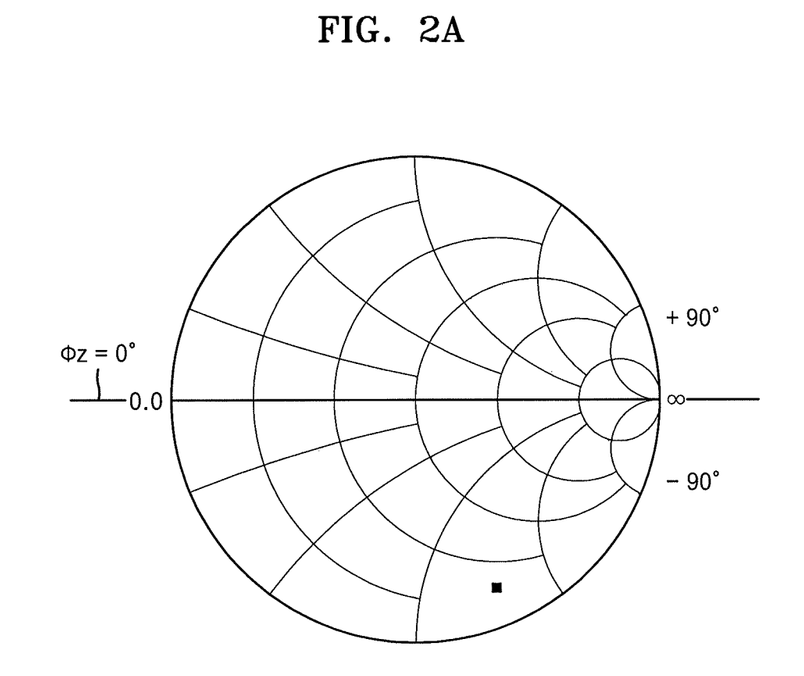
FIGS. 2A and 2B illustrate Smith charts showing a relation between a phase of an impedance and a length of a transmission line in the PE system in FIG. 1A.
Figure 2B:
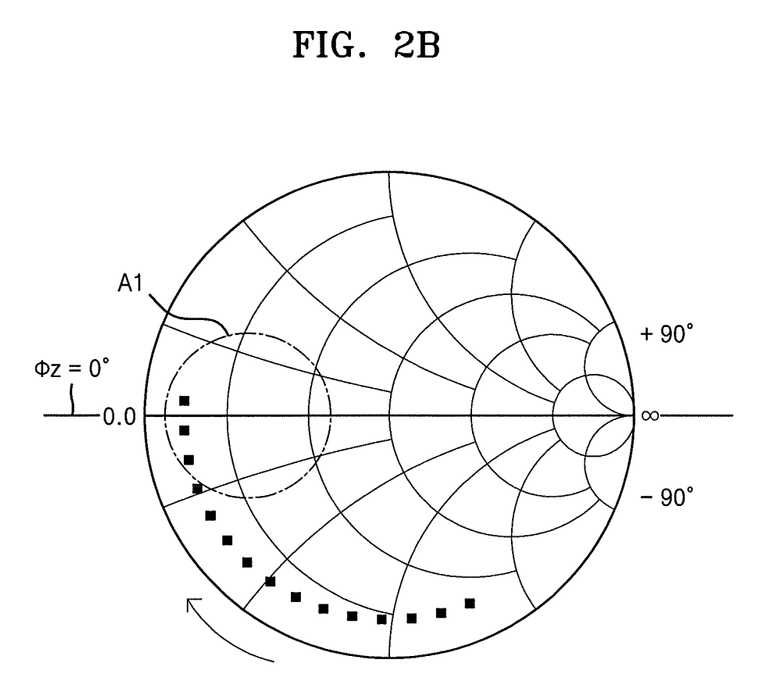

Referring to FIGS. 2A and 2B, the RF generator 200 may generate RF power and thus supply the RF power to the plasma chamber 400. For example, the RF generator 200 may generate and output RF power with a frequency range from several MHz to several tens of MHz (e.g., about 1 MHz to about 99 MHz). Further, the RF generator 200 may generate RF power with a frequency of several hundreds of MHz (e.g., about 100 MHz) or more or may generate RF power with a frequency range from several tens of kHz to several MHz (e.g., about 10 kHz to about 9 MHz), but is not limited to. The RF generator 200 may generate and output several hundreds of Watts (W) to several thousands of Watts (e.g., about 100 W to about 9,999 W), but is not limited to.

In an embodiment, referring to FIGS. 1A and 1B, the RF generator 200 in the PE system 1000 may correspond to a power supply for supplying RF power, and the plasma chamber 400 may correspond to a type of load to receive the RF power. Thus, the first RF sensor 110 may monitor or measure the delivered RF power, which is transferred from the RF generator 200 to the plasma chamber 400 through the first transmission line 120, and/or the impedance of the plasma chamber 400.

The matcher 300 may control an amount of the delivered RF power according to impedance thereof. For example, the matcher 300 may allow the RF power from the RF generator 200 to be maximally transferred to the plasma chamber 400 by adjusting the impedance thereof. For example, the matcher 300 may adjust the impedance thereof such that a complex conjugate condition is satisfied based on a maximum power delivery theory. For example, the matcher 300 may function to maximally transfer the RF power from the RF generator 200 to the plasma chamber 400 by allowing the RF generator 200 to be driven in a 50Ω environment that minimizes a reflection of the RF power. For example, when the matcher 300 has 50Ω impedancce, a loss of the RF power from the RF generator 200 may be minimized.

The matcher 300 may be connected to the RF generator 200 via a second transmission line 250. For example, the second transmission line 250 may be a line for supplying RF power, e.g., a coaxial cable.

The plasma chamber 400 may include a chamber body 410, an electrostatic chuck 430, and a shower head 450. The plasma chamber 400 may be a chamber for a plasma process, e.g., a plasma reactor chamber. The plasma chamber 400 may include, e.g., a capacitively coupled plasma (CCP) chamber, an inductively coupled plasma (ICP) chamber, or a chamber using a combination of CCP and ICP. For example, in an example embodiment, the plasma chamber 400 in the PE system 1000 may include various types of chambers, e.g., an electron cyclotron resonance (ECR) plasma chamber, a surface wave plasma (SWP) chamber, a helicon wave plasma chamber, an electron beam (e-beam) plasma chamber, and the like.

The chamber body 410 may be a reaction space, in which plasma is formed. For example, the reaction space may be sealed off from outside thereof. The chamber body 410 may be formed of, e.g., a metal material and be grounded to block noise from outside thereof during a plasma process. An insulating liner may be arranged inside the chamber body 410. The insulating liner may protect the chamber body 410 and may prevent arcing generation or the like within the plasma chamber 400 by covering protruding metal structures of the chamber body 410.

A gas inlet, a gas outlet, a view-port, or the like may be arranged in the chamber body 410. A process gas for a plasma process may be supplied via the gas inlet. For example, the process gas may be gases for the plasma process, e.g., a source gas, a reaction gas, a purge gas, and the like. After the plasma process, gases inside the plasma chamber 400 may be discharged outside the plasma chamber 400 via the gas outlet. Further, an inside pressure of the plasma chamber 400 may be adjusted by the gas outlet. One or more view-ports may be arranged in the chamber body 410, and an inner space of the plasma chamber 400 may be monitored via each view-port.

The electrostatic chuck 430 may be arranged in a lower region inside the plasma chamber 400, and a wafer 2000 that is a target of the plasma process may be arranged on an upper surface of the electrostatic chuck 430 and secured thereto. The electrostatic chuck 430 may secure the wafer 2000 with electrostatic force.

The shower head 450 may be arranged in an upper region inside the plasma chamber 400 and may inject process gasses, which are supplied via the gas inlet, into the plasma chamber 400 via a plurality of jet holes. The shower head 450 may function as an electrode for transferring RF power. Thus, the first transmission line 120 from the matcher 300 and/or the first RF sensor 110 may be connected to the shower head 450.

According to an embodiment, the electrostatic chuck 430 may be a transfer electrode for transferring RF power. Thus, an RF generator and a matcher may be connected to the electrostatic chuck 430. For example, during the plasma process, the shower head 450 may, as a transfer electrode, transfer RF power, and the electrostatic chuck 430 may function as ground. On the other hand, the electrostatic chuck 430 may, as a transfer electrode, transfer RF power, and the shower head 450 may function as ground. Further, the electrostatic chuck 430 and the shower head 450 may be alternately used as a transfer electrode.

For example, a PE system for semiconductor mass-production equipment may transfer RF power to a plasma chamber by using an RF generator based on intended reaction gases and pressure and a physical configuration of an electrode. Further, impedance of the plasma chamber may have a combination of real-number resistance and imaginary-number resistance and have a phase ($\varphi z$) that is not 0° and the impedance of the plasma chamber may deviate from 50Ω. To transfer maximum RF power in such an environment, a complex conjugate condition may be satisfied based on the maximum power delivery theory, and as described above, the matcher 300 may be arranged between the RF generator 200 and the plasma chamber 400 and perform such a function to maximize the delivered RF power. For example, in terms of current and voltage, a phase (φz) of impedance of the plasma chamber may correspond to a phase difference between current and voltage.

Figure 3:
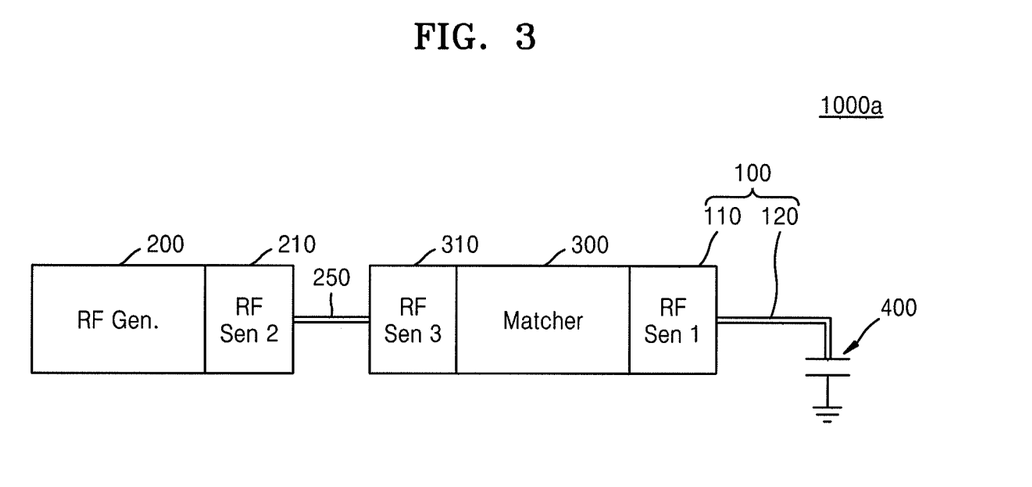
FIGS. 3 to 5 illustrate embodiments of a PE systems.

In an example embodiment, referring to FIG. 3, the RF power transferred from the RF generator 200 may be monitored with a second RF sensor 210 that is mounted to an output stage of the RF generator 200. Further, the first RF sensor 110 may be mounted between the matcher 300 and the plasma chamber 400, be mounted to the output stage of the matcher 300, and thus measure the delivered RF power to the plasma chamber 400 and/or the impedance of the plasma chamber 400. The first RF sensor 110 may be significant in accurately monitoring a state of the plasma chamber 400 in terms of tool-to-tool matching (TTTM).

Figure 4:
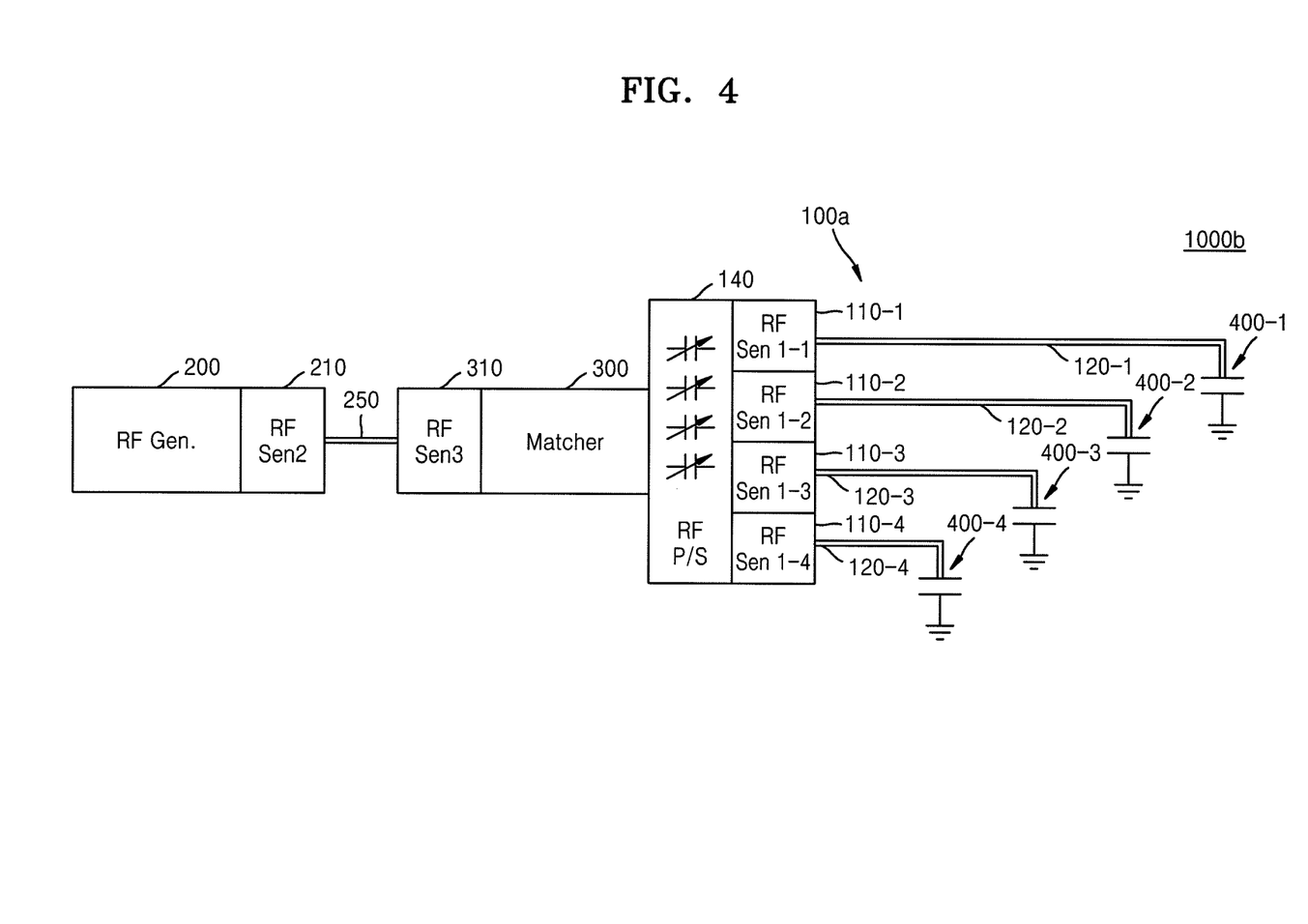

In an example embodiment, referring to FIG. 4, in a PE system 1000b, RF power from one RF generator 200 is split by an RF power splitter 140 and supplied to two or more plasma chambers. In this case, it may be significant in terms of securing mass-productivity to check and adjust a balance between a plurality of delivered RF powers to the respective plasma chambers and/or between impedances of the respective plasma chambers.

Compared to the second RF sensor 210 mounted to the output stage of the RF generator 200, the first RF sensor 110, which is arranged between the matcher 300 and the plasma chamber 400, may measure the delivered RF power and/or impedance of the target load, for example, the plasma chamber 400, in a non-50Ω environment. For example, the plasma chamber 400 may not have 50Ω impedance. In other words, the first RF sensor 110 may measure the delivered RF power and/or impedance of the plasma chamber 400 in an environment in which the phase (φz) of the impedance is not 0° or a multiple of 180°. Thus, the measured RF power and/or the impedance of the plasma chamber 400 by the first RF sensor 110 may have errors due to the non-50Ω environment. Further, the errors may dramatically increase as the phase (φz) of the impedance gets closer to 90°. For example, when an RF sensor is used for general purposes, a measurement error may be increased up to ±10% as a maximum, in a range in which the phase (φz) of the impedance is close to 90° (e.g., in a range of 60°<|φz|≤80°), as compared to actually delivered RF power. For example, in a range in which the phase (φz) of the impedance is close to 0° (e.g., in a range of 0°<|φz|≤10°), the measurement error may be reduced up to ±0.5%. Thus, an error of an RF sensor according to a phase variation of impedance of a target load may not be reduced. Further, the measurement error of the delivered RF power of the plasma chamber 400 and/or the impedance thereof may not be reduced due to such a drawback of an RF sensor.

In an example embodiment, in the PE system 1000, the phase (φz) of the impedance of the plasma chamber 400 may be moved into a range of 0°<|φz|<30°, which is a stable range, based on a transmission line theory such that the measurement error from the first RF sensor 110 regarding the delivered RF power may be reduced. In an example embodiment, the PE system 1000 may adjust the physical size, the physical properties, or the like of the transmission line 120 in the RF power monitoring device 100 based on the transmission line theory such that the phase (φz) of the impedance of the plasma chamber 400 may be in the range of 0°<|φz|<30° or, for more precise measurement, to be in the range of 0°<|φz|≤10°. Thus, the measurement error from the first RF sensor 110 regarding the delivered RF power to the plasma chamber 400 and/or the impedance of the plasma chamber 400 may be significantly reduced. For example, the range of 0°<|φz|<30° may be more broadly changed to an ranged of −30°+180°*n<φz<30°+180°*n (where n=−2, −1, 0, 1, or 2) based on characteristics of the phase (φz).

For reference, the transmission line theory may be briefly described with reference to FIG. 1B, as follows. In a circuit in which the first RF sensor 110 is connected to the target load (e.g., the plasma chamber 400) via the first transmission line 120, input impedance Zin viewed from the first RF sensor 110 may be represented by the following Equation (1).

$$Zin = Z_0 * (Z_L + Z_0 \tan h(\gamma 1))/(Z_0 + Z_L \tan h(\gamma 1)) \quad (1)$$

In Equation (1), $Z_0$ is characteristic impedance of the first transmission line 120, $Z_L$ is the impedance of the target load (e.g., the plasma chamber 400), γ is a propagation constant, and 1 is a length of the first transmission line 120. The first transmission line 120 may be, e.g., a coaxial cable.

In Equation (1), each of $Z_0$, $Z_L$, and γ is a fixed value, and only 1, which is the length of the first transmission line 120, is a variable value. Thus, a phase of the input impedance Zin may be minimized by adjusting 1, which is the length of the first transmission line 120. For example, the phase (φz) of the input impedance Zin may be within the range of 0°<|φz|<30° by adjusting 1, which is the length of the first transmission line 120.

FIGS. 2A and 2B are Smith charts showing a relation between a phase of impedance and the length of a transmission line in the PE system 1000 in FIG. 1A. Descriptions will be made with reference to FIGS. 2A and 2B together with FIGS. 1A and 1B.

Referring to FIGS. 2A and 2B, when the phase (φz) of the impedance of the target load (e.g., the plasma chamber 400) is in a range of 60°<|φ|≤80°, a value of the delivered RF power, which is measured by the first RF sensor 110, may have an error of up to ±10% as a maximum, and this may cause faults in a process for a wafer 2000. Further, referring to FIG. 4, when a plurality of plasma chambers 400-1, 400-2, 400-3, and 400-4 are provided in a PE system 1000b, measurement errors of first RF sensors 110-1, 110-2, 110-3, and 110-4 regarding the delivered RF power may be distributed according to a process dispersion between wafers.

FIG. 2A illustrates a Smith chart showing that the phase (φz) of the impedance of the plasma chamber 400 is arranged close to −80°. For example, the impedance of the plasma chamber 400 with the phase (φz) of about −80° may be measured when RF power at a high frequency of several tens of MHz is transferred to the plasma chamber 400 (e.g., a target load) through the first transmission line 120 (e.g., a coaxial cable) of about several meters (m).

For reference, in the Smith chart, a horizontal line in a central area may be a line with a phase of 0° or 180° and correspond to a case in which the impedance has no reactance component and only a resistance component. Further, as a location on the Smith Chart moves from a 0.0 region in a clockwise or counterclockwise direction, an absolute value of the phase of the impedance may increase. For example, an upper region with respect to the horizontal line may correspond to an inductance component in the reactance component. As the location on the Smith chart moves in the clockwise direction from the 0.0 region, the phase of the impedance may increase toward +90. Further, a lower region with respect to the horizontal line may correspond to a capacitance component in the reactance component. As the location on the Smith chart moves in the counterclockwise direction from the 0.0 region, the phase of the impedance may increase toward −90.

FIG. 2B illustrates a Smith chart showing that the impedance of the plasma chamber 400 may be measured when the RF power at a high frequency of several tens of MHz is transferred to the plasma chamber 400 (e.g., a target load) through the first transmission line 120 (e.g., a coaxial cable) with the length that gradually increases to about two times thereof. For example, as the transmission line theory is applied, it may be confirmed that the phase ($\varphi z$) of the impedance of the plasma chamber 400 moves close to 0° from −80, as indicated by the arrow in FIG. 2B.

As illustrated in FIG. 2B, a region indicated by a dashed single-dotted line may represent a stable region A1 in which the phase ($\varphi z$) of the impedance is equal to or less than ±10°. In particular, the progression from an initial starting impedance of FIG. 2A to the stable region A1 by gradually adjusting the length of the first transmission line 120 is indicated by squares in FIG. 2B. Thus, the phase ($\varphi z$) of the impedance may be in the stable region A1 by adjusting the length of the first transmission line 120 based on the transmission line theory. As a result, the measurement error from the first RF sensor 110 regarding the delivered RF power may be reduced from about ±10% to about ±0.5%.

Hereinafter, a method of adjusting a phase of impedance will be described with reference to examples of the first transmission line 120. For example, the first transmission line 120 may be implemented as a coaxial cable. The coaxial cable may include, e.g., a central conductor, an outer conductor, an insulator, and an outer sheath. The coaxial cable may have a structure in which the central conductor and the outer conductor are coaxially arranged. The insulator may fill a space between the central conductor and the outer conductor and may include an insulation material, e.g., polyethylene. For example, when the coaxial cable is thick, a spacer of a circular plate shape may be used as the insulator. Further, when the coaxial cable is for high temperature use, Teflon (e.g., polytetrafluoroethene) may be used as the insulator. The outer sheath may surround the outer conductor and may include, for example, vinyl, plastic, or the like.

For example, the coaxial cable may be suitable for broadband transmission due to low attenuation at high frequencies and have low signal leakage due to the outer conductor. Thus, the coaxial cable may be mainly used as a transmission cable at high frequencies. For example, the coaxial cable may transfer RF power with a frequency range from several MHz to several tens of MHz. For example, coaxial cables may have characteristic impedance of 50Ω or 70Ω.

In an example embodiment, the RF power monitoring device 100 in the PE system 1000 may use the coaxial cable as the first transmission line 120 that connects the first RF sensor 110 to the plasma chamber 400. Further, the coaxial cable may also be used as the second transmission line 250 that connects the RF generator 200 to the matcher 300.

In the RF power monitoring device 100, the phase of the impedance of the plasma chamber 400 may be moved near 0° by adjusting the length of the coaxial cable. Thus, the measurement error of the first RF sensor 110 regarding the delivered RF power may be minimized. In an example, embodiment, the coaxial cable in the PE system 1000 for the first transmission line 120 and/or the second transmission line 250 may transfer RF power with a frequency range from several MHz to several tens of MHz. Thus, in the RF power monitoring device 100, the phase of the impedance of the plasma chamber 400 may be moved near 0° by adjusting the length of the coaxial cable corresponding the first transmission line 120 to several meters.

In an example embodiment, the first transmission line 120 may be implemented as a waveguide. The waveguide may refer to a hollow conduit that is used for a transmission line and includes a conductor. The waveguide may have a circular cross-section or a quadrangular cross-section. An outer wall of the waveguide may include, e.g., a copper plate, an aluminum plate, or the like. The waveguide may effectively transfer microwaves or ultra-high frequency waves. For example, for microwaves, the waveguide may have much lower loss than two parallel wires or a coaxial cable and transfer much higher power than a coaxial cable with an equal dimension thereto.

In an example embodiment, the RF power monitoring device 100 in the PE system 1000 may use the waveguide as the first transmission line 120 that connects the first RF sensor 110 to the plasma chamber 400. Further, the waveguide may also be used as the second transmission line 250 that connects the RF generator 200 to the matcher 300.

In an example embodiment, in the RF power monitoring device 100, the phase of the impedance of the plasma chamber 400 may be moved near 0° by adjusting a physical size of the waveguide. Thus, the measurement error from the first RF sensor 110 regarding the delivered RF power may be minimized. For example, in the PE system 1000, the waveguide for the first transmission line 120 and/or the second transmission line 250 may transfer RF power with a frequency of several hundreds of MHz or more, e.g., ultra-high frequency waves or microwaves. Thus, in an RF power monitoring device 100a, the phase of the impedance of the plasma chamber 400 may be moved near 0° by adjusting the physical size of the waveguide corresponding to the first transmission line 120. For example, when the cross-section of the waveguide has a circular shape, the diameter of the cross-section thereof may be adjusted, or when the cross-section of the waveguide has a quadrangular shape, the length or width of the cross-section thereof may be adjusted. Thus, the phase of the impedance of the plasma chamber 400 may be moved near 0°.

In an example embodiment, the first transmission line 120 may be implemented as an RF strap. The RF strap may include, e.g., a strap conductor, a ground housing, and an insulator. The strap conductor may have a band-like shape extending in one direction. The ground housing may have a circular tube shape that surrounds the strap conductor with a constant distance from the strap conductor. The ground housing may protect the strap conductor from RF radiation. The insulator may fill a space between the strap conductor and the ground housing.

In an example embodiment, the transmission line 120 may be implemented as an RF rod. The RF rod may include, e.g., a rod conductor instead of the strap conductor. For example, the RF rod may include, e.g., a rod conductor, a ground housing, and an insulator, and the rod conductor may have a circular pillar shape extending in one direction.

In an example embodiment, the RF power monitoring device 100 in the PE system 1000 may use the RF strap or the RF rod as the first transmission line 120 connecting the first RF sensor 110 to the plasma chamber 400. Further, the RF strap or the RF rod may also be used as the second transmission line 250 that connects the RF generator 200 to the matcher 300.

For example, in the RF power monitoring device 100, the phase of the impedance of the plasma chamber 400 may be moved near 0° by adjusting a physical size or physical properties of the RF strap or RF rod. Thus, the measurement error from the first RF sensor 110 regarding the delivered RF power may be minimized. For example, in the PE system 1000, the RF strap or RF rod for the first transmission line 120 and/or the second transmission line 250 may transfer RF power with, for example, a frequency range from several MHz to several tens of MHz. Thus, in the RF power monitoring device 100, the phase of the impedance of the plasma chamber 400 may be moved near 0° by adjusting the physical size or physical properties of the RF strap or RF rod corresponding to the first transmission line 120.

The adjustment of the physical size of the RF strap or RF rod may include adjusting the length of the strap conductor or rod conductor, adjusting a space size of the ground housing, or the like. For example, the adjustment of the space size of the ground housing may include adjusting and optimizing a distance between the strap conductor or rod conductor and the ground housing. Further, the adjusting of the physical properties of the RF strap or RF rod may include adjusting the permittivity and/or permeability thereof by changing the material of the insulator.

Figure 5:
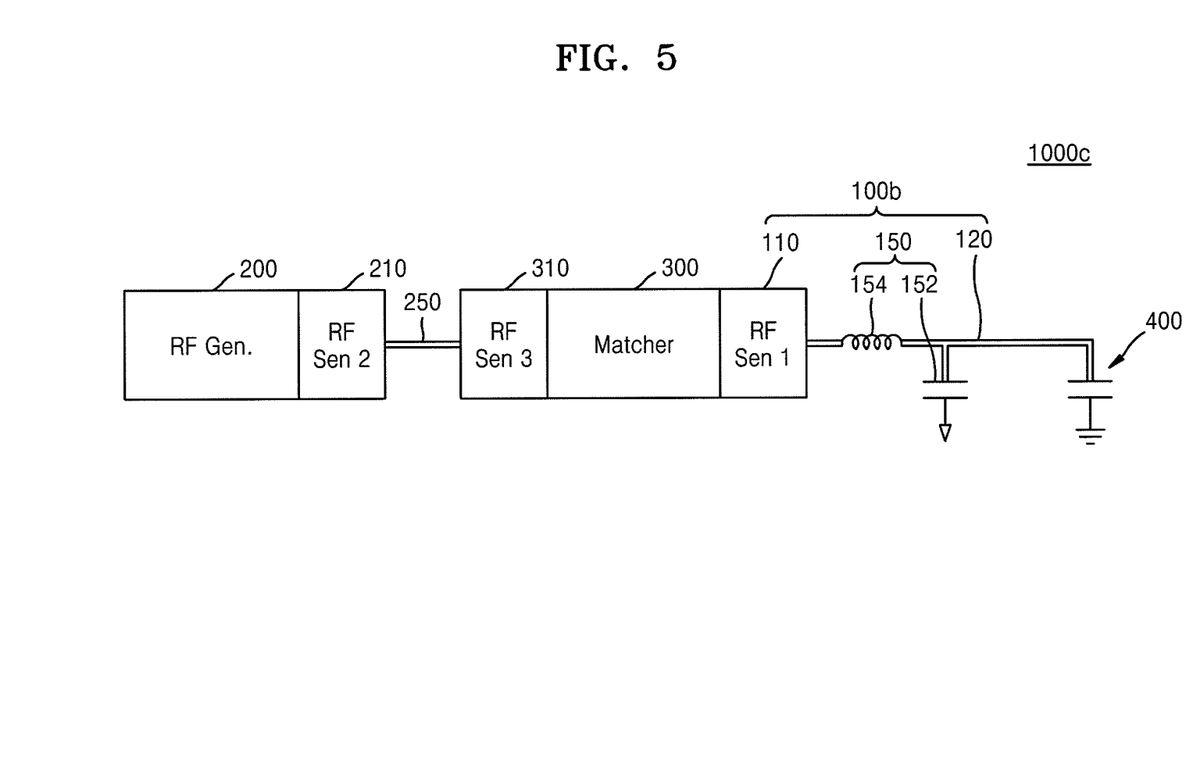

FIGS. 3 to 5 illustrate PE systems according to embodiments, and each of FIGS. 3 to 5 may correspond to FIG. 1B. Repeated descriptions made with reference to FIGS. 1A to 2B will be briefly given or be omitted.

In an example embodiment, referring to FIG. 3, the PE system 1000a may be different from and may further include the second RF sensor 210 and a third RF sensor 310 compared to the PE system 1000 in FIGS. 1A and 1B. For example, the second RF sensor 210 in the PE system 1000a may be mounted to the output stage of the RF generator 200. The third RF sensor 310 in the PE system 1000a may be mounted to the input stage of the matcher 300. For example, the output stage of the matcher 300 may refer to a first portion, through which RF power is output from the matcher 300 in a transfer direction of the RF power from the RF generator 200 to the plasma chamber 400. The input stage of the matcher 300 may refer to a second portion, through which RF power is input to the matcher 300.

For example, the second RF sensor 210 may be internally mounted to the output stage of the RF generator 200 and monitor delivered RF power and reflected RF power. The matcher 300 may minimize the reflected RF power by driving the RF generator 200 in a 50Ω environment. Thus, the second RF sensor 210 may monitor the delivered RF power under the condition that the phase ($\varphi z$) of the impedance of the target load is 0° such that the measurement error may be minimized. For example, the third RF sensor 310 may perform a monitoring operation under the condition that the phase ($\varphi z$) of the impedance of the target load is 0°. Thus, an operation state of the matcher 300 may be checked, and feedback loop control may be performed. For reference, the target load may refer to an overall load that is measured by a corresponding RF sensor.

In an example embodiment, the PE system 1000a may include the first RF sensor 110, the second RF sensor 210, the third RF sensor 310, or the like. In general, a typical PE system may not include a RF sensor in an output stage of a matcher such that internal power loss of the matcher 300 or a state of a plasma chamber may not be directly checked. In contrast, because the PE system 1000a includes the first RF sensor 110 in the output stage of the matcher 300, power loss internal to the matcher 300 or a state of the plasma chamber 400 in terms of TTTM may be directly checked. Thus, the PE system 1000a including the first RF sensor 110 may be more precisely operated. Further, because the PE system 1000a includes the first RF sensor 110 in the output stage of the matcher 300, a drawback of the typical PE system may be solved. Further, the phase of the impedance is moved near 0° by adjusting the physical size or physical properties of the first transmission line 120 such that the measurement error of the first RF sensor 110 regarding the delivered RF power may be minimized.

For reference, in semiconductor technology, mass production has been considered as being more significant through generations, and thus, a technique capable of directly monitoring processes of the mass production has been developed. In this regard, the PE system 1000 of FIGS. 1A and 1B and the PE system 1000a in FIG. 3 may be able to directly monitor process statues of the plasma chamber 400 by mounting the first RF sensor 110 in the output stage of the matcher 300.

As described above, because the impedance of the plasma chamber 400 inevitably includes an imaginary part, the phase of the impedance may not be 0°. Thus, the measurement error regarding the delivered RF power and the impedance may be generated from the first RF sensor 110. Further, the measurement error of the first RF sensor 110 may increase as the phase of the impedance is closer to 90°. In contrast, in the PE system 1000 of FIGS. 1A and 1B and the PE system 1000a in FIG. 3, the phase of the impedance is moved near 0° by adjusting the physical size or physical properties of the first transmission line 120 in the RF power monitoring device 100. Thus, the measurement error of the first RF sensor 110 regarding the delivered RF power may be minimized, and the drawback set forth above may be solved.

For reference, when the RF generator 200 as a source of RF power is provided alone, e.g., without the first RF sensor 110, the delivered RF power, which is transferred to the plasma chamber 400, may be monitored and managed even without using the method of moving the phase of the impedance near 0°. In other words, when internal loss of the matcher 300 is constant for each unit of the matcher 300, the delivered RF power to the plasma chamber 400 may be monitored and managed by anticipating the internal loss of the matcher 300 based on a value from the second RF sensor 210 that is reliable.

In an example embodiment, referring to FIG. 4, a PE system 1000b may further include the RF power splitter 140, four first RF sensors 110-1 to 110-4, and four plasma chambers 400-1 to 400-4 compared to the PE system 1000a of FIG. 3. For example, in the PE system 1000b, the RF power splitter 140, which splits RF power from the RF generator 200 into a plurality of partial RF powers, may be arranged in the output stage of the matcher 300. For example, the RF power splitter 140 may split the RF power into four pieces of partial RF power. For example, the four first RF sensors 110-1 to 110-4 and the four plasma chambers 400-1 to 400-4 may be arranged to correspond to the four partial RF powers that are divided by the RF power splitter 140. Further, the RF power monitoring device 100a in the PE system 1000b may include the four first RF sensors 110-1 to 110-4, four first transmission lines 120-1 to 120-4, and the RF power splitter 140.

In an example embodiment, in the PE system 1000b, although the RF power is split into the four partial RF powers by the RF power splitter 140, the number of partial RF powers may be changed. For example, the RF power splitter 140 may split the RF power into two, three, or five or more partial RF powers. Further, each of the first RF sensor 110 and the plasma chamber 400 may also be arranged by as many as the number of partial RF powers.

In an example embodiment, the PE system 1000b may be a system with a structure in which, to obtain several good effects in terms of mass production as described above, the RF power from the single RF generator 200 is split and supplied to the four plasma chambers 400-1 to 400-4 by using the RF power splitter 140. In the case of such a system of a split structure, balanced distribution of the RF power may directly influence a process. Thus, the first RF sensors 110-1 to 110-4, which are able to check the delivered RF power transferred to the plasma chambers 400-1 to 400-4 in real time, may be significant in controlling the PE system 1000b in mass production.

When an existing PE system is configured in a split structure, first sensors may have accuracy issues according to impedances of plasma chambers, as described above. In contrast, in the PE system 1000b, a phase of the impedance of each of the plasma chambers 400-1 to 400-4 may be moved near 0° by adjusting a physical size or physical properties of each of the first transmission lines 120-1 to 120-4. Thus, measurement errors from the first RF sensors 110-1 to 110-4 regarding the delivered RF power may be minimized, and the drawback set forth above may be solved.

In an example embodiment, referring to FIG. 5, a PE system 1000c may further include a passive element 150 in the first transmission line 120 compared to the PE system 1000a of FIG. 3. For example, the passive element 150 in the PE system 1000c may include a capacitor 152 and/or an inductor 154 and be arranged in the first transmission line 120. For example, an RF power monitoring device 100b in the PE system 1000c may include the first RF sensor 110, the first transmission line 120, and the passive element 150.

In general, when RF power has a low frequency and a wavelength of several tens meters, it may be difficult to move a phase of impedance of a plasma chamber by adjusting a length of a transmission line, e.g., a coaxial cable. In contrast, in an example, embodiment, the PE system 1000c may move the phase of the impedance of the plasma chamber 400 near 0° by using the passive element 150. Thus, the measurement error from the first RF sensor 110 regarding the delivered RF power may be minimized, and the drawback set forth above may be solved. For example, the phase of the impedance of the plasma chamber 400 may be moved near 0° by changing a connection configuration of the passive element 150 and/or changing the capacitance or inductance of the passive element 150. For example, the passive element 150 may include fixed passive elements having fixed values of capacitance or inductance, or variable passive elements having variable values of capacitance or inductance. The variable passive elements will be described below in more detail with reference to FIGS. 6A and 6B.

Figure 6A:
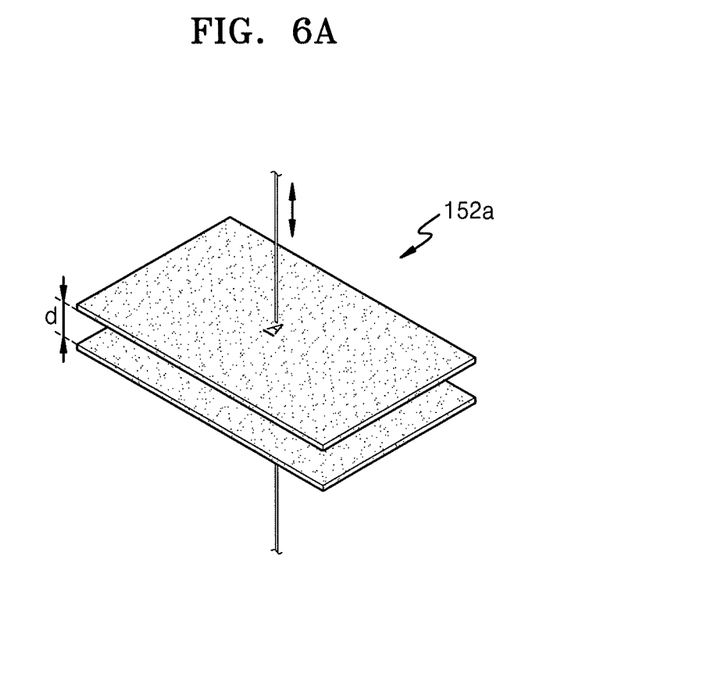
FIGS. 6A and 6B illustrate a variable capacitor and a variable inductor that are included in a transmission line in the PE system in FIG. 1A.
Figure 6B:
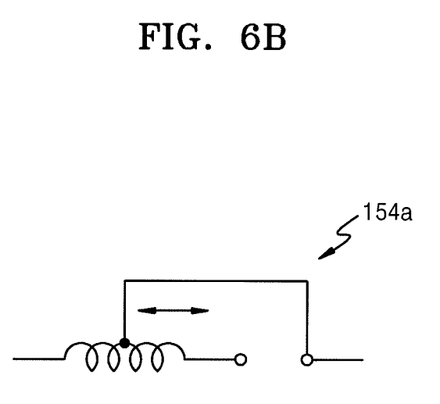

FIGS. 6A and 6B illustrate a variable capacitor and a variable inductor, which are included in the first transmission line 120 in the PE system 1000c in FIG. 5. Descriptions will be made with reference to FIGS. 6A and 6B together with FIG. 5, and repeated descriptions made with reference to FIGS. 1A to 5 will be briefly given or be omitted.

In an example embodiment, referring to FIG. 6A, a variable capacitor 152a may include upper and lower conductive plates that are apart from each other with a distance d. For example, the distance d between the upper and lower conductive plates may be adjusted to control a capacitance thereof. Further, a space between the upper and lower conductive plates may be filled with a dielectric or be empty. The capacitance of the variable capacitor 152a may be represented by an area A of a conductive plate and the distance d between the upper and lower conductive plates. The capacitance (C) of the variable capacitor 152a may be represented by $C=\varepsilon_r \varepsilon_0 * A/d$, wherein $\varepsilon_0$ is vacuum permittivity and $\varepsilon_r$ is relative permittivity of a dielectric.

The capacitance of the variable capacitor 152a may be changed by adjusting the distance d between the upper and lower conductive plates. For example, at least one selected from a group consisting of the upper conductive plate and the lower conductive plate may be moved in a direction indicated by an arrow in FIG. 6A. Thus, the distance d between the upper and lower conductive plates may be changed, and the capacitance of the variable capacitor 152a may be changed. For example, the upper and lower conductive plates may be precisely moved by an electrical device.

In an example embodiment, referring to FIG. 6B, a variable inductor 154a may have a coil structure, e.g., a variable length coil. For example, an inductance of the variable inductor 154a may be changed by changing a position of a connection terminal connected to the variable inductor 154a. For example, in the variable inductor 154a, the position of the connection terminal may be shifted in a direction indicated by an arrow in FIG. 6B. Thus, a length of the variable inductor 154a, which functions as an inductor, may be changed, and the inductance of the variable inductor 154a may be changed. For example, with respect to the position of the connection terminal, a left portion of the variable inductor 154a may function as an inductor, and a right portion of the variable inductor 154a may not function as an inductor. For example, the position of the connection terminal may be precisely shifted by an electrical device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A radio frequency (RF) power monitoring device, comprising:
   an RF sensor to monitor RF power from an RF generator that is transferred to a target load, and to monitor an impedance of the target load, the RF sensor being between the RF generator and the target load; and
   a transmission line between the RF sensor and the target load to electrically connect the RF sensor to the target load and to transfer the RF power to the target load, wherein:
   the transmission line between the RF sensor and the target load is configured such that a phase ($\varphi z$) of the impedance of the target load sensed by the sensor is adjusted to satisfy a range of $-30°+180° * n < \varphi z < 30°+180° * n$ (where n=−2, −1, 0, 1, or 2).

2. The RF power monitoring device of claim 1, wherein:
   the target load is a plasma chamber,
   the transmission line is a coaxial cable,
   the RF sensor is arranged to an output stage of a matcher and is connected to the plasma chamber through the transmission line, and
   the phase of the impedance of the target load sensed by the sensor is adjusted by adjusting a length of the coaxial cable.

3. The RF power monitoring device of claim 2, wherein:
the plasma chamber includes at least two plasma chambers,
the coaxial cable includes at least two coaxial cables corresponding to the at least two plasma chambers,
the RF sensor includes at least two RF sensors corresponding to the at least two coaxial cables,
the RF power monitoring device further includes an RF power splitter that is arranged to the matcher and splits the RF power into a plurality of partial RF powers, and
a phase of the impedance of each plasma chamber corresponding to each coaxial cable and sensed by the at least two RF sensors is adjusted by adjusting the length of each coaxial cable.

4. The RF power monitoring device of claim 2, wherein the length of the coaxial cable is adjusted to minimize the phase of the impedance of the target load sensed by the sensor based on a transmission line theory.

5. The RF power monitoring device of claim 1, wherein:
the target load is a plasma chamber,
at least one passive element is included in the transmission line, and
the phase of the impedance of the target load sensed by the sensor is adjusted by controlling an electrical characteristic of the at least one passive element.

6. The RF power monitoring device of claim 1, wherein:
the target load is a plasma chamber,
the transmission line is a waveguide, and
the phase of the impedance of the target load sensed by the sensor is adjusted by adjusting a physical size of the waveguide.

7. The RF power monitoring device of claim 1, wherein:
the target load is a plasma chamber,
the transmission line is an RF strap or an RF rod, and
the phase of the impedance of the target load sensed by the sensor is adjusted by adjusting a length of the RF strap or the RF rod.

8. The RF power monitoring device of claim 1, wherein:
the target load is a plasma chamber,
the transmission line is an RF strap or an RF rod, and
the phase of the impedance of the target load sensed by the sensor is adjusted by adjusting a space size between the RF strap or the RF rod and a ground housing surrounding the RF strap or the RF rod or by adjusting permittivity or permeability of a dielectric filling between the RF strap or the RF rod and the ground housing.

9. The RF power monitoring device of claim 1, wherein:
the target load is a plasma chamber, and
the plasma chamber includes a capacitively coupled plasma (CCP) chamber, an inductively coupled plasma (ICP) chamber, or a combination of the CCP and the ICP.

10. A radio frequency (RF) power monitoring device, comprising:
an RF power splitter to split RF power from an RF generator into a plurality of partial RF powers and to supply the plurality of partial RF powers to a plurality of plasma chambers;
RF sensors between the RF generator and the plurality of plasma chambers, the RF sensors being arranged to an output stage of the RF power splitter, each RF sensor to monitor each partial RF power transferred to each plasma chamber and an impedance of each plasma chamber; and
transmission lines between the RF sensors and the plurality of plasma chambers to electrically connect between the RF sensors and the plurality of plasma chambers, each transmission line to transfer each corresponding partial RF power to each corresponding plasma chamber, wherein:
the transmission lines between the RF sensors and the plurality of plasma chambers are configured such that a phase of the impedance of each plasma chamber sensed by the sensors is adjusted by adjusting a physical size or a physical property of each transmission line.

11. The RF power monitoring device of claim 10, wherein the phase ($\varphi z$) of the impedance of each plasma chamber sensed by the sensors is adjusted to satisfy a range of $-30°+180° * n < \varphi z < 30°+180° * n$ (where n=−2, −1, 0, 1, or 2).

12. The RF power monitoring device of claim 11, wherein each transmission line is one of a coaxial cable, a waveguide, an RF strap, and an RF rod.

13. The RF power monitoring device of claim 11, wherein:
a frequency of the RF power ranges from several MHz to several tens of MHz,
each transmission line is a coaxial cable, and
the phase of the impedance of each plasma chamber sensed by the sensors is adjusted by adjusting a length of the coaxial cable.

14. The RF power monitoring device of claim 11, wherein:
a frequency of the RF power is equal to or greater than several hundreds of MHz,
each transmission line is a waveguide, and
the phase of the impedance of each plasma chamber sensed by the sensors is adjusted by adjusting a physical size of the waveguide.

15. The RF power monitoring device of claim 11, wherein:
a frequency of the RF power ranges from several tens of kHz to several MHz,
each transmission line is one of a coaxial cable, an RF strap, and an RF rod, and
the phase of the impedance of each plasma chamber sensed by the sensors is adjusted by including a passive element in each transmission line.

16. The RF power monitoring device of claim 11, wherein:
each transmission line is an RF strap or an RF rod, and
the phase of the impedance of each plasma chamber sensed by the sensors is adjusted using at least one method selected from:
a first method of adjusting a length of the RF strap or the RF rod;
a second method of adjusting a space size between the RF strap or the RF rod and a ground housing surrounding the RF strap or the RF rod; and
a third method of adjusting a permittivity or a permeability of a dielectric filling between the RF strap or the RF rod and the ground housing.

17. A plasma enhanced (PE) system, comprising:
a radio frequency (RF) generator to generate RF power;
a plasma chamber to receive the RF power;
a matcher between the RF generator and the plasma chamber, the matcher to reduce a reflection of the RF power;
an RF sensor between the RF generator and the plasma chamber, the RF sensor being arranged to an output stage of the matcher and to monitor the RF power transferred to the plasma chamber and an impedance of the plasma chamber; and a transmission line between the RF sensor and the plasma chamber to electrically connect the RF sensor to the plasma chamber and to transfer the RF power to the plasma chamber, wherein:

the transmission line between the RF sensor and the plasma chamber is configured such that a phase ($\varphi z$) of the impedance of the plasma chamber sensed by the sensors is adjusted to satisfy a range of $-30°+180° * n < \varphi z < 30°+180° * n$ (where $n = -2, -1, 0, 1,$ or $2$), by adjusting a physical size or a physical property of the transmission line.

18. The PE system of claim 17, wherein:

the plasma chamber includes a plurality of plasma chambers, the PE system further includes an RF power splitter that is arranged to the matcher and splits the RF power into a plurality of partial RF powers corresponding to the plurality of plasma chambers, the RF sensor includes a plurality of RF sensors, and the transmission line includes a plurality of transmission lines, wherein each corresponding partial RF power is supplied to each plasma chamber through each corresponding transmission line and is monitored by each corresponding RF sensor.

19. The PE system of claim 17, wherein:

the transmission line is one of a coaxial cable, a waveguide, an RF strap, and an RF rod.

20. The PE system of claim 19, wherein the matcher minimizes reflected power so that the RF generator operates in a 50Ω environment.

\* \* \* \* \*